US006433600B2

(12) United States Patent
Ilkbahar

(10) Patent No.: US 6,433,600 B2
(45) Date of Patent: *Aug. 13, 2002

(54) METHOD AND APPARATUS FOR GLITCH PROTECTION FOR INPUT BUFFERS IN A SOURCE-SYNCHRONOUS ENVIRONMENT

(75) Inventor: Alper Ilkbahar, Santa Cruz, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/452,885

(22) Filed: Dec. 1, 1999

Related U.S. Application Data

(63) Continuation of application No. 09/045,167, filed on Mar. 19, 1998, now Pat. No. 6,016,066.

(51) Int. Cl.[7] .................................................. H03K 3/02
(52) U.S. Cl. ........................ 327/198; 327/23; 327/379
(58) Field of Search ............................. 327/189, 141, 327/153, 161, 162, 198, 379, 142, 23, 25–27; 326/21, 22, 23, 70, 94, 97

(56) References Cited

U.S. PATENT DOCUMENTS

| | | | | |
|---|---|---|---|---|
| 4,297,593 A | * | 10/1981 | Allen | 327/197 |
| 4,424,455 A | * | 1/1984 | Neely | 327/295 |
| 4,939,394 A | | 7/1990 | Hashimoto | 327/155 |
| 5,036,227 A | | 7/1991 | Jo et al. | 326/94 |
| 5,184,032 A | * | 2/1993 | Leach | 326/98 |
| 5,231,636 A | * | 7/1993 | Rasmussen | 370/100.1 |
| 5,327,076 A | * | 7/1994 | Bailey | 324/158.1 |
| 5,511,170 A | * | 4/1996 | Abdoo | 395/280 |
| 5,706,484 A | | 1/1998 | Mozdzen et al. | 713/400 |
| 5,723,995 A | | 3/1998 | Mozdzen et al. | 327/293 |
| 5,774,001 A | | 6/1998 | Mozdzen et al. | 327/141 |
| 5,812,121 A | * | 9/1998 | Hughes | 345/211 |
| 5,898,321 A | | 4/1999 | Ilkbahar et al. | 326/87 |
| 6,016,066 A | * | 1/2000 | Ilkbahar | 327/23 |

* cited by examiner

Primary Examiner—Timothy P. Callahan
Assistant Examiner—Hai L. Nguyen
(74) Attorney, Agent, or Firm—Blakely, Sokoloff, Taylor & Zafman LLP

(57) ABSTRACT

A method and apparatus for glitch protection for differential strobe input buffers in a source-synchronous environment. The present invention provides a solution to the problem of noise sensitivity of differential strobe input buffers in a source-synchronous environment, which may cause functional problems. The present invention enables the use of fully differential strobe signals to improve electrical performance of the source synchronous data transfers while removing the noise sensitivity problem associated with these signals. This is accomplished by providing a glitch protection circuit that provides protection against input glitches for a first predetermined period of time after each strobe transition. The present invention also provides a detection circuit that detects when both differential strobe signals are in the same logic state, which corresponds to a transition between bus masters (a dead cycle). The detection circuit causes the glitch protection circuit to latch the output signal of the glitch detection circuit.

24 Claims, 6 Drawing Sheets

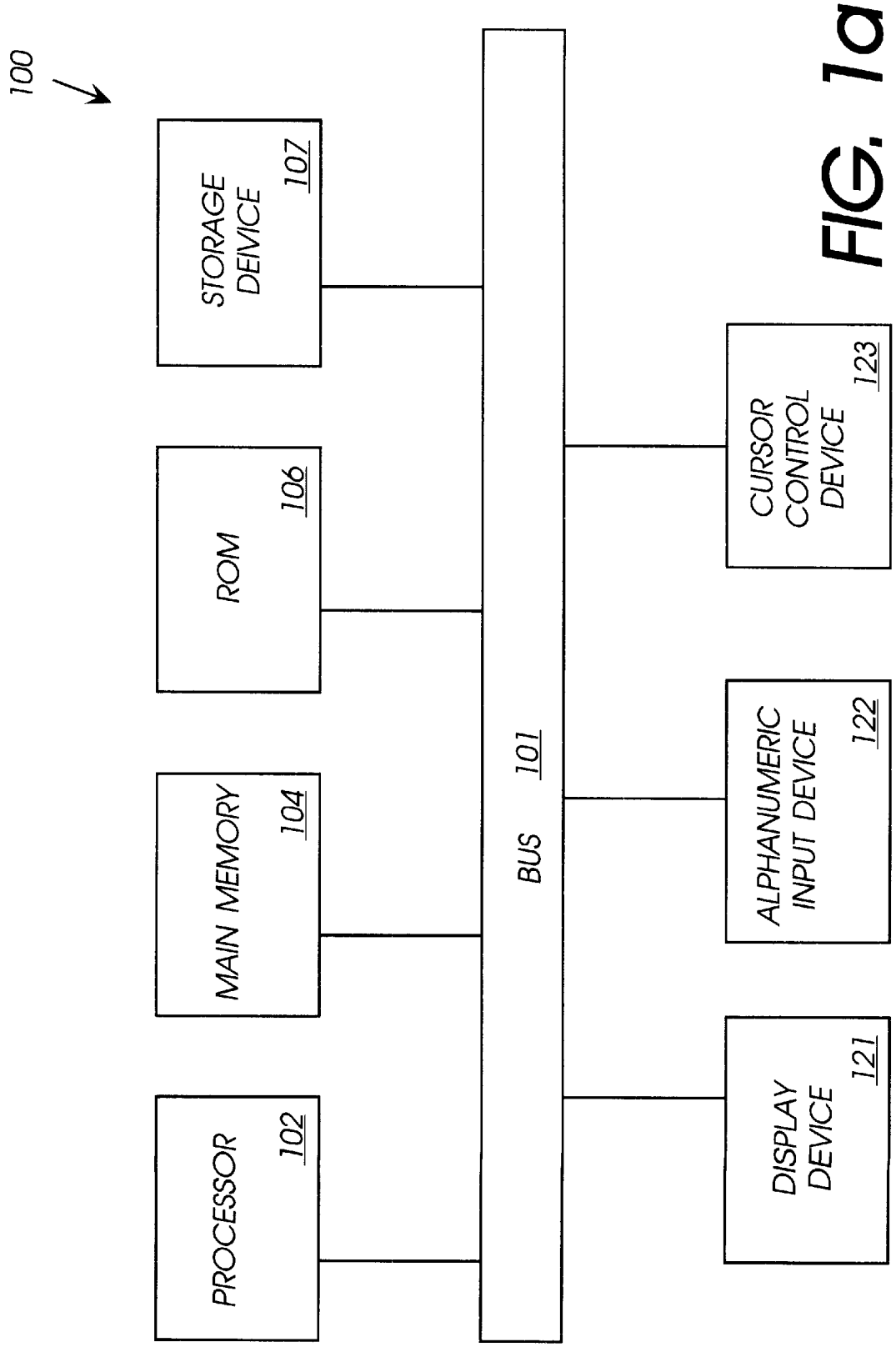

METHOD AND APPARATUS FOR GLITCH PROTECTION FOR INPUT BUFFERS IN A SOURCE-SYNCHRONOUS ENVIRONMENT

This patent application is a continuation of U.S. patent application Ser. No. 09/045,167 filed Mar. 19, 1998, now U.S. Pat. No. 6,016,066.

FIELD OF THE INVENTION

The present invention relates to signal transmissions. More specifically, the present invention relates to communicating signals in a source synchronous environment.

BACKGROUND OF THE INVENTION

As operating speeds of processors and computer systems increase, communication between components, such as memories and I/O devices, must increase to reduce or eliminate bottleneck problems. One solution to this communications problem is to provide a source-synchronous environment in which components of a system operate. In a source-synchronous environment, strobe signals are sent between components along with data signals. The strobe signals are used to communicate timing information. Instead of having one or more components operate on a common clock signal, data may be communicated at a speed not set by a clock signal. The strobe signal sent with the data may be used, for example, to start an internal clock signal, for latching of the data, or other timing purposes.

Source synchronous communication eliminates many problems of traditional, common clocked, data transfers, such as flight time delays, clock skew, etc. to increase data transfer rates over traditional data transfer schemes. However, single-strobe source-synchronous data transfers are susceptible to noise. For example, switching of data bits may generate timing glitches that cause functional problems in the system because the glitches may be considered valid data. Glitches become more of a problem as operating frequencies increase.

Alternatively, differential-strobe source-synchronous data transfers may be used to communicate data. By using differential amplifiers with a high common mode rejection ratio (CMRR), common mode noise problems may be reduced or eliminated. Differential-strobe source-synchronous data transfers, however, are susceptible to glitches when both strobe signals are in the same logic state, such as during transfer of bus control between bus agents on an externally terminated bus. This is the result of differential amplifiers being sensitive to noise during a time when both strobe signals are driven high, such as when one bus agent relinquishes the bus and a different bus agent acquires the bus.

Therefore, what is needed is glitch protection for differential strobe signals in a source synchronous environment.

SUMMARY OF THE INVENTION

A method and apparatus for providing glitch protection for differential strobe signals in a source-synchronous environment is described. A pair of strobe signals are received and glitch protection is provided by latching the strobe signals for a first predetermined period of time in response to strobe transitions. When both strobe signals are in equivalent logic states, a latching signal is generated to latch the strobe signals. In one embodiment, the latching signal is generated a second predetermined period of time after the strobe signals are in equivalent logic states. In one embodiment, the first predetermined period of time is greater than the second predetermined period of time.

BRIEF DESCRIPTION OF THE DRAWINGS

The present invention is illustrated by way of example, and not by way of limitation, in the figures of the accompanying drawings in which like reference numerals refer to similar elements and in which:

FIG. 1a is one embodiment of a single-processor computer system;

DETAILED DESCRIPTION

Figure 1B:
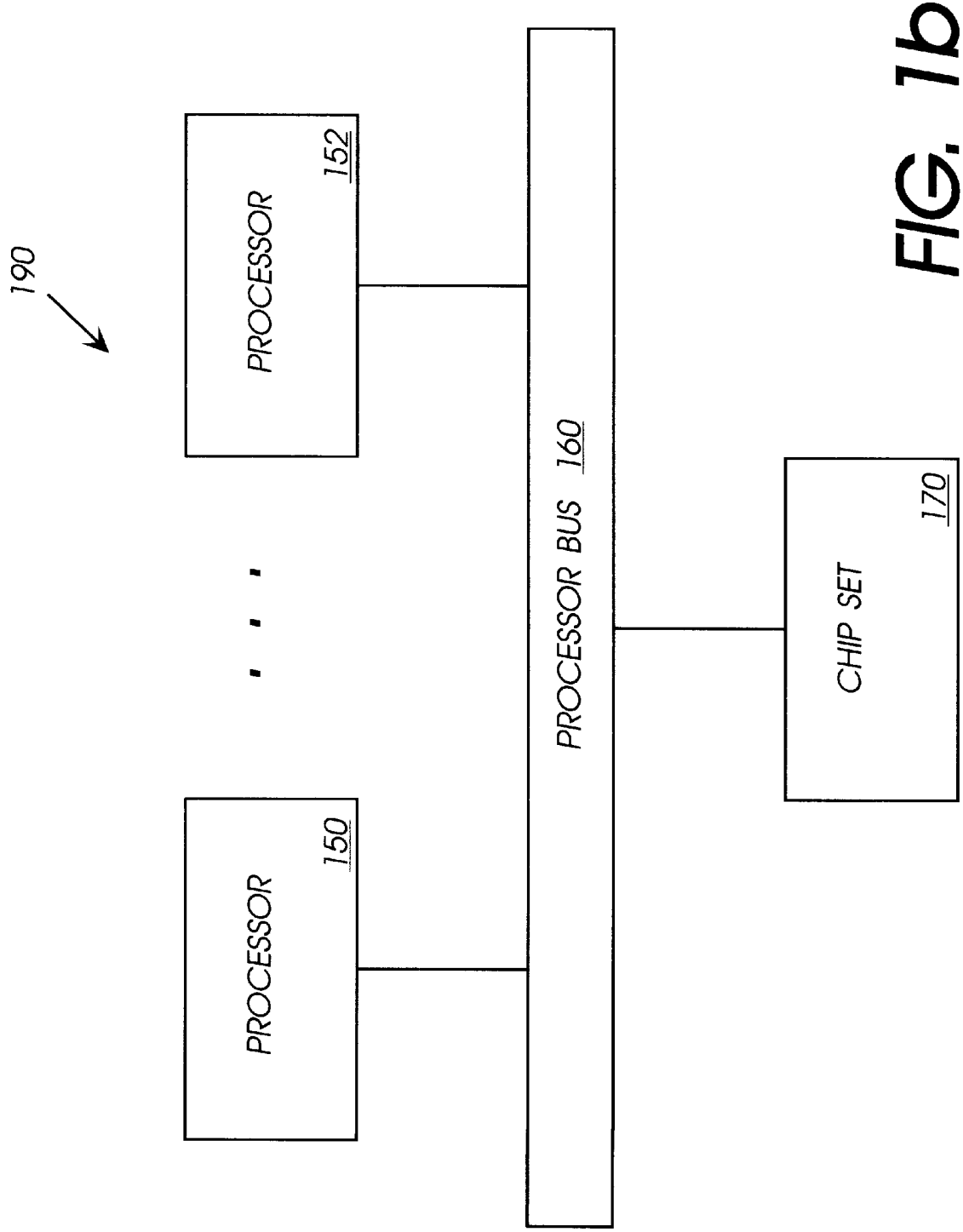
FIG. 1b is one embodiment of a multi-processor computer system.

A method and apparatus for providing glitch protection for input buffers in a source-synchronous environment is described. In the following description, for purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid obscuring the present invention.

The present invention provides a solution to the problem of noise sensitivity of differential strobe and other input buffers in a source-synchronous environment, which may cause functional problems. The present invention enables the use of fully differential strobe signals to improve electrical performance of source synchronous data transfers while removing the noise sensitivity problem associated with externally terminated buses. This is accomplished by providing a glitch protection circuit that provides protection against input glitches for a first predetermined period of time after each signal transition. The present invention also provides a detection circuit that detects when both differential strobe signals are in the same logical state, which corresponds to a transition between bus agents (e.g., a dead cycle). The detection circuit causes the glitch protection circuit to latch the output signal of the glitch detection circuit.

FIG. 1a is one embodiment of a computer system. Computer system 100 comprises bus 101 or other device for communicating information, and processor 102 coupled with bus 101 for processing information. Computer system 100 further comprises random access memory (RAM) or other dynamic storage device 104 (referred to as main memory), coupled to bus 101 for storing information and instructions to be executed by processor 102. Main memory 104 also may be used for storing temporary variables or other intermediate information during execution of instructions by processor 102. Computer system 100 also comprises read only memory (ROM) and/or other static storage device 106 coupled to bus 101 for storing static information and instructions for processor 102. Data storage device 107 is coupled to bus 101 for storing information and instructions.

Data storage device 107 such as magnetic disk or optical disc and corresponding drive can be coupled to computer system 100. Computer system 100 can also be coupled via bus 101 to display device 121, such as a cathode ray tube (CRT) or liquid crystal display (LCD), for displaying information to a computer user. Alphanumeric input device 122, including alphanumeric and other keys, is typically coupled to bus 101 for communicating information and command selections to processor 102. Another type of user input device is cursor control 123, such as a mouse, a trackball, or cursor direction keys for communicating direction information and command selections to processor 102 and for controlling cursor movement on display 121.

In one embodiment, processor 102 and one or more of the components coupled to bus 102, such as main memory 104, are source-synchronous components. Of course, any one or more components of computer system 100 may be source synchronous. Thus, computer system 100 may be either a partially source synchronous or fully source synchronous environment.

FIG. 1*b* is one embodiment of a multiprocessor computer system. Computer system 190 generally includes multiple processors (e.g., processor 150 through processor 152) coupled to processor bus 160. Chip set 170 provides an interface between processor bus 160 and other components of computer system 190, such as a system bus (not shown in FIG. 1*b*).

Computer system 190 is a higher performance system than computer system 100 in both bus architecture and number of processors. In one embodiment, processor bus 160 is an externally terminated bus that communicates information in a source synchronous manner. Processors 150 and 152 may be any type of processor. In one embodiment, processors 150 and 152 are from the Intel Corporation family of processors available from Intel Corporation of Santa Clara, Calif. Chip set 170 provides an interface between processor bus 160 and the remaining components of computer system 190 in any manner known in the art.

Figure 2:
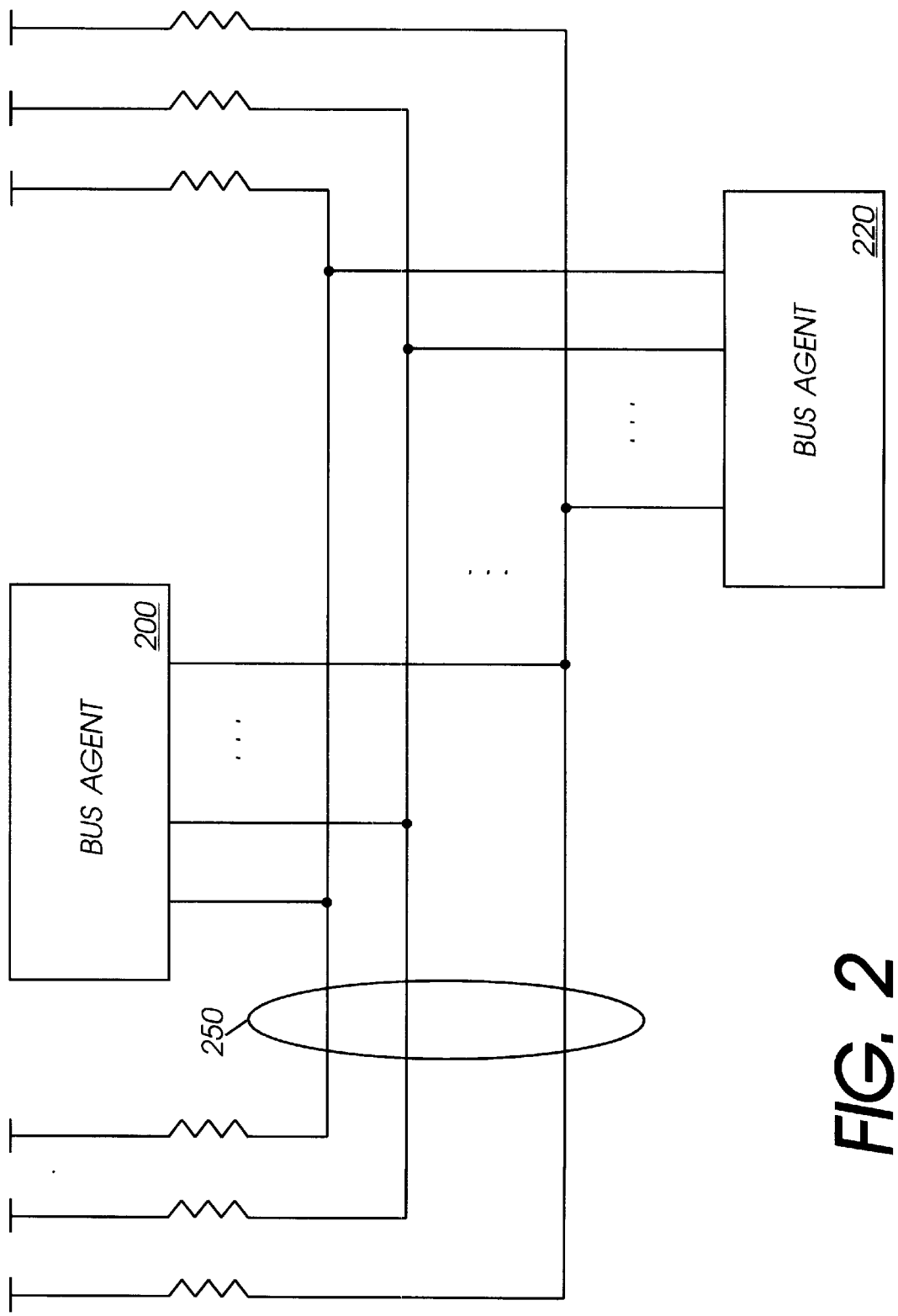
FIG. 2 is one embodiment of an externally terminated bus having two bus agents.

FIG. 2 is one embodiment of an externally terminated bus having two bus agents. In one embodiment, each line of bus 250 is externally terminated by a pair of pull-up resistors or other devices, such as transistors, that allow the individual bus lines to be pulled up to a known voltage when no agents are driving bus 250.

The system of FIG. 2 includes two bus agents, labeled 200 and 220, which may be any of the components of computer system 100, such as processor 102, main memory 104, etc., or components of computer system 190, such as processors 150 and 152 or chip set 170. Bus agents 200 and 220 may also be components not described with respect to FIGS. 1*a* and 1*b*, such as, for example, I/O devices, or any other component that may be coupled to bus 250.

In one embodiment, each line of bus 250 is terminated with a pair of resistors, one of which is coupled between each end of the individual bus lines and a known voltage. When bus 250 is not being driven by a bus agent, the lines of bus 250 are pulled up to a known voltage.

Alternatively, each line of bus 250 is terminated with a pair of p-channel metal-oxide semiconductor (PMOS) transistors each having a drain coupled to an end of the bus line terminated (not shown in FIG. 2). Each transistor has a source coupled to a voltage supply output or other voltage source. The gates of the transistors are coupled to control circuitry that switches the transistors on at appropriate times to pull the voltage of the bus lines to a known level. Line termination is well known in the art and will not be described further with respect to the present invention.

In a system having multiple bus agents and a terminated bus, the bus agents that are not driving the bus place their output lines in a high-impedance state (e.g., tri-state the outputs). The bus agent (e.g., bus master) that is driving the bus outputs signals in any manner appropriate for the bus interface.

For example, bus agent 200 may drive bus 250 for a number of bus cycles. During this time, bus agent 220 tri-states any output lines coupled to bus 250. When bus agent 200 relinquishes bus 250, output lines from bus agent 200 are tri-stated. At this time, the outputs from both bus agents 200 and 220 are tri-stated, and the pull-up resistors pull the voltage of the bus lines up to a known voltage. The time during which no bus agent is driving bus 250 is known as a dead cycle.

After the dead cycle, bus agent 220 may drive bus 250. To do this, bus agent 220 drives its output lines to the appropriate voltage levels. During the time bus agent 220 drives the bus, the outputs of bus agent 200 are tri-stated. During a dead cycle, all of the bus lines are pulled high, thus differential strobe signals are not complementary during the dead cycle. Circuits, such as input buffers, that receive differential signals under normal bus operation must be designed to operate properly during dead cycles.

Figure 3:
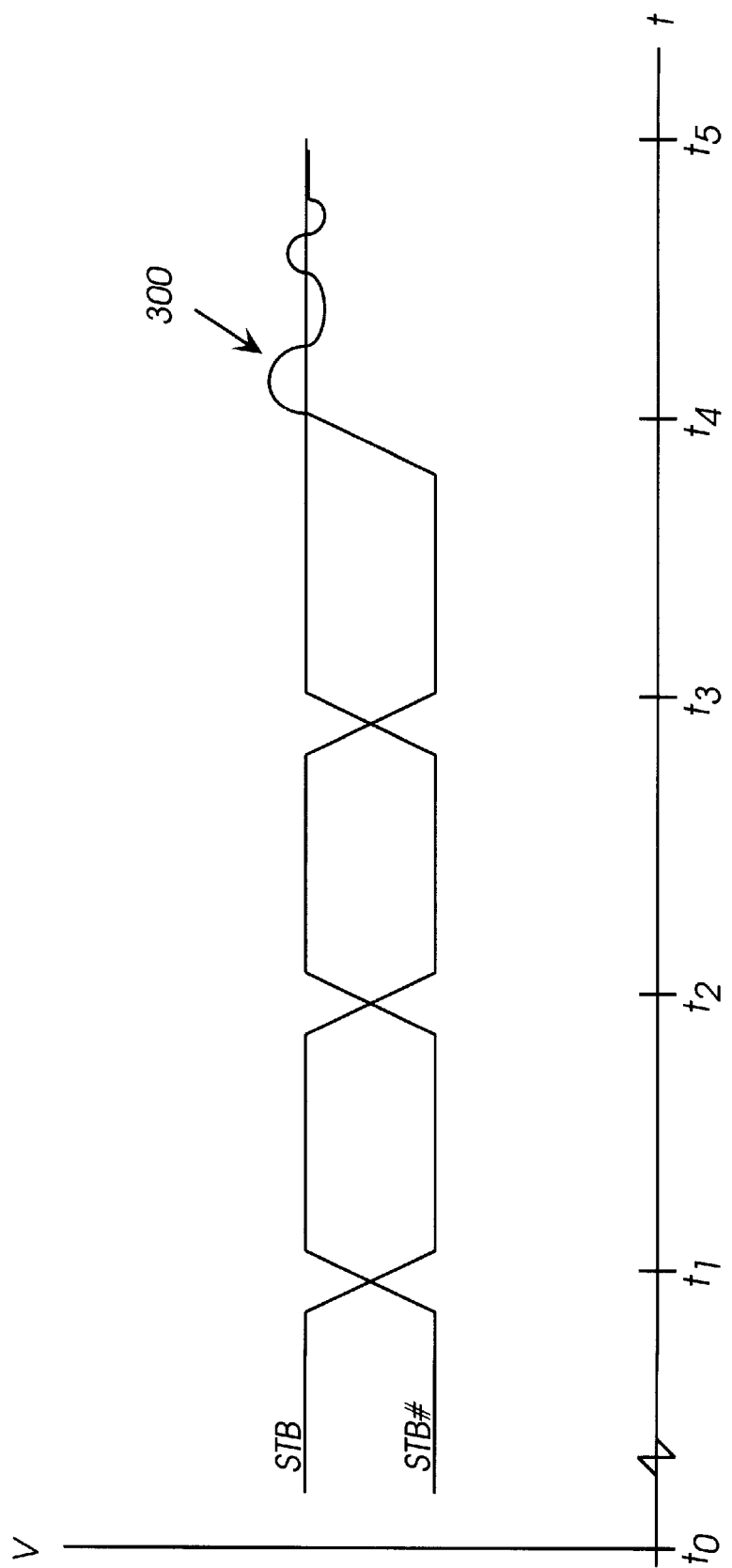
FIG. 3 is one embodiment of a timing diagram having a glitch that may trigger differential input buffers.

FIG. 3 is one embodiment of a timing diagram having a glitch that may trigger differential input buffers. A glitch is more likely to occur when both the strobe signal (STB) and the complemented strobe signal (STB#) are driven high. This may occur during the dead cycle. However, glitches may occur for any signal on the bus and therefore, glitch protection described with respect to STB and STB# are equally applicable to the other signals whether a differential pair, or any other type of signal. It is important to note that the complemented strobe signal is not a truly complemented strobe signal. During bus cycles that are not dead cycles STB# is the logical complement of STB. However, during dead cycles, both STB and STB# are driven high by the pull-up resistors providing termination to the bus.

In the timing diagram of FIG. 3, the time period t1 through t3 are ordinary bus cycles where one bus master drives the bus and strobe signals STB and STB# are used to communicate in a differential-signal source-synchronous manner. The time period from t3 to t4 is a dead cycle. During the time period from t3 to t4, STB# is maintained in a high logical state from the previous time period and STB is pulled up by a termination pull-up resistor. When STB is pulled up and STB# is maintained high, differential sense amplifiers that receive STB and STB# as inputs are more sensitive to noise than during normal operation because the voltage differential between STB and STB# is smaller than during normal operation.

During dead cycles when both STB and STB# are pulled high, a glitch, such as glitch 300 may provide enough voltage differential to the differential input buffer to respond as if a differential signals was received. Therefore, it is desirable to provide differential input buffers with glitch protection. The dead cycle of FIG. 3 is described as having STB# maintained high and STB being pulled high during the dead cycle. It is important to note, however, that the opposite case (STB maintained high and STB# being pulled high) is equally applicable. Glitch protection for data signals may also be provided because overshoots or other glitches may also cause functional errors resulting in unintended logical transitions. Glitches may be functionally fatal because they may propagate errors into component cores, such as a processor core or a cache memory core. Therefore, glitch protection may be provide to both differential strobe input buffers and data input buffers. Glitch protection may also be provided in a non-source synchronous environment, if desired.

Figure 4:
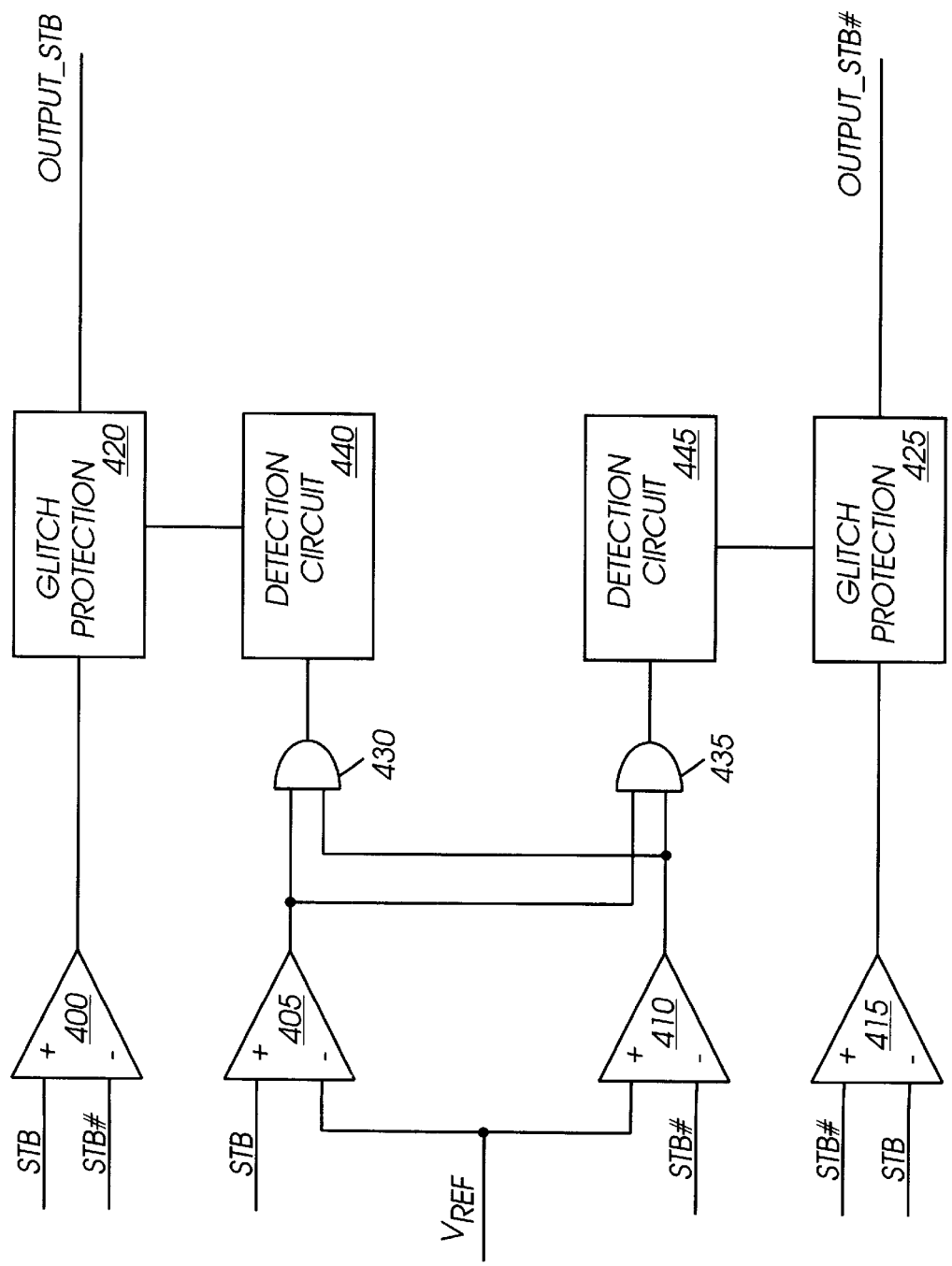
FIG. 4 is one embodiment of a block diagram of a circuit for providing glitch protection.

FIG. 4 is one embodiment of a block diagram of a circuit for providing glitch protection. The block diagram of FIG. 4 is glitch protection circuitry coupled between the bus that communicates the STB and STB# signals to the data buffers that use the differential strobe signals. The signals generated by the circuitry of FIG. 4 (OUTPUT_STB and OUTPUT_STB#) are the strobe signals received by data buffers (not shown in FIG. 4).

In one embodiment, the present invention includes four differential sense amplifiers, labeled 400, 405, 410 and 411. Amplifier 400 is a differential amplifier that receives STB at the positive input terminal and STB# at the negative input terminal. Amplifier 400 generates a positive output voltage in response to a high STB signal and a low STB# signal. Amplifier 415 is configured in the opposite manner. The positive input terminal of amplifier 415 is coupled to receive STB# and the negative input terminal is coupled to receive STB#.

Differential amplifiers 405 and 410 are pseudo-differential input buffers that use a reference voltage (Vref) as an input. Amplifier 405 is coupled to receive STB at the positive input terminal and Vref at the negative input terminal. Amplifier 410 is coupled to receive Vref at the positive input terminal and STB# at the negative input terminal. Because amplifiers 405 and 410 are pseudo-differential, these input buffers are not sensitive to glitches when STB and STB# are simultaneously high.

Output signals from amplifier 405 and 410 are coupled to the inputs of logic gates 430 and 435. In one embodiment, logic gates 430 and 435 are AND gates (shown in FIG. 4); however, logic gates 430 and 435 may be replaced with alternative circuitry that provide AND functionality as well as other signals (not shown in FIG. 4). An alternative embodiment for logic gates 430 and 435 is described below with respect to FIG. 5. Alternatively, logic gates 430 and 435 may be NAND gates to detect when STB and STB# are simultaneously low. Of course, detection logic gates 430 and 435 may be designed to detect both when STB and STB# are simultaneously and when STB and STB# are simultaneously low.

An output signal from logic gate(s) 430 is coupled to detection circuit 440 and an output signal from logic gate(s) 435 is coupled to detection circuit 445. In one embodiment, the output signals generated by logic gates 430 and 435 communicated to detection circuits 440 and 445 are generated in response to STB and STB# being simultaneously high. Detection circuits 440 and 445 generate control signals in response to STB and STB# being simultaneously high.

In one embodiment, detection circuits 440 and 445 generate output signals in response to STB and STB# being simultaneously high. The output signals are generated after STB and STB# have been simultaneously high for a predetermined period of time. If STB and STB# remain high for the predetermined period of time, the bus is in a dead cycle and the strobe signals are latched into a high state. The predetermined period of time is used so that transients in either STB or STB# do not indicate to detection circuitry that the bus is in a dead cycle when a dead cycle is not occurring.

Glitch protection circuits 420 and 425 provide glitch protection for each transition of STB and STB#, respectively. In one embodiment, glitch protection is provided by a latching of the respective strobe signals for a predetermined length of time in response to a strobe transition. It is important to note that the glitch protection delay time is longer than the detection delay time and both delay times are less than the length of time required for a dead cycle. Latching STB and STB# provide glitch protection by latching a known, acceptable voltage while the input signal, STB or STB#, settles. Glitch protection may also be provided for other, non-strobe signals, on the bus.

Glitch protection circuit 420 provides a glitch-free version of STB, labeled OUTPUT_STB, to data buffers (not shown in FIG. 4). Similarly, glitch protection circuit 425 provides a glitch-free version of STB#, labeled OUTPUT_STB#, to data buffers (also not shown in FIG. 4). These glitch-free strobe signals are used as input strobe to data buffers.

Figure 5:
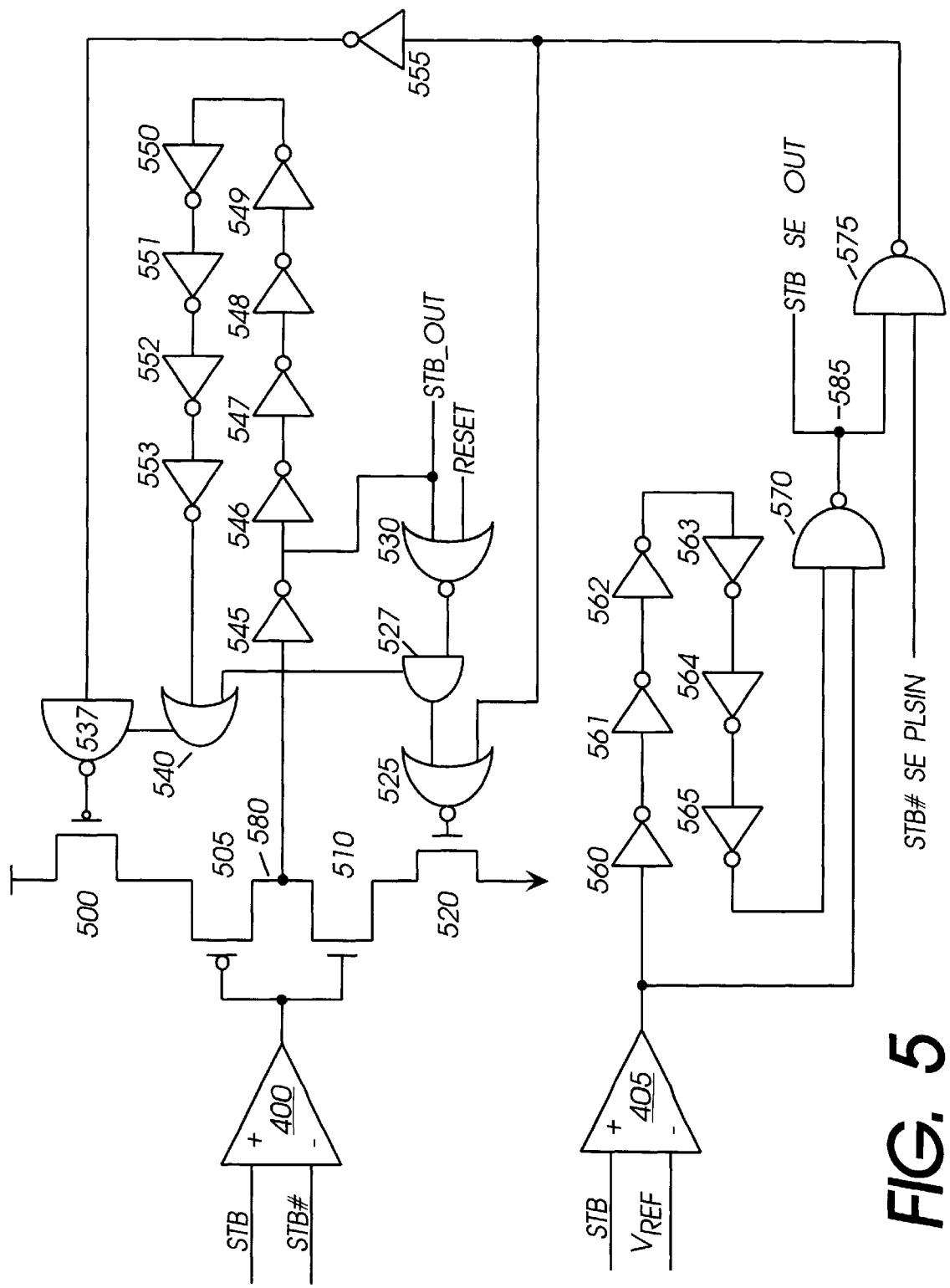
FIG. 5 is one embodiment of a circuit for providing glitch protection.

FIG. 5 is one embodiment of a circuit for providing glitch protection. The circuit of FIG. 5 provides glitch protection for STB and not for STB#. To provide glitch protection for STB#, the same circuitry is used except input signals provided to the differential sense amplifiers are coupled as described below.

Differential amplifier 400 is coupled to receive STB at the positive input terminal and STB# at the negative input terminal. The output of differential amplifier 400 is generated in response to the voltage difference between STB and STB#. Pseudo-differential amplifier 405 is coupled to receive STB at the positive input terminal and Vref at the negative input terminal. The output of differential amplifier 405 is generated in response to the voltage difference between STB and Vref.

It is important to note that in order to provide glitch protection for STB#, only the input signals to the two differential amplifiers are changed (not shown in FIG. 5). The remaining portion of the circuit, and thus the remaining description of the circuit of FIG. 5 applies equally to glitch protection for STB and for STB#. To provide glitch protection for STB#, the differential amplifier (e.g., 415 in FIG. 4) is coupled to receive STB# at the positive input terminal and STB at the negative input terminal. The output of this differential amplifier is generated in response to the voltage difference between STB# and STB. The pseudo-differential amplifier (e.g., 410 in FIG. 4) is coupled to receive Vref at the positive input terminal and STB# at the negative input terminal. The output of this differential amplifier is generated in response to the voltage difference between Vref and STB#.

The output of amplifier 400 is commonly coupled to the gates of transistors 505 and 510. In one embodiment, transistor 500 is a PMOS transistor and transistor 510 is an NMOS transistor. Transistors 505 and 510 are coupled to invert the signal received from amplifier 400. The inverted signal is output at node 580, which provides an input signal to OR gate 540, AND gate 527 and inverter 545. The output of inverter 545 is fed through multiple inverters, labeled 546–553, coupled in series to provide a delayed signal. In one embodiment, the number of inverters is chosen to provide the desired amount of delay and is an even number such that the signal output from the last inverter is a delayed version of the signal at node 580. Alternatively, delay may be provided by other logic gates, or in another manner.

The signal at node 580 and the delayed signal provided by inverter string 546–553 operate through OR gate 540 and NAND gate 537 to provide a voltage to turn transistor 500 off for a predetermined period of time in response to differential amplifier 400 detecting a transition of strobe signals STB and STB#. Similarly, the signal at node 580 operates through AND gate 527 and NOR gate 525 to provide a voltage at the gate of transistor 520 to turn transistor 520 off for a predetermined length of time in response to amplifier 400 detecting a transition of the strobe signals.

A signal external to the circuit of FIG. 5, RESET may be used to turn transistors 500 off through inverter string 546–553, OR gate 540 and NAND gate 537. Similarly, the two external signals may be used to turn transistor 520 off through NOR gate 530, AND gate 527, and NOR gate 525. RESET are not required to practice the present invention, and therefore, are not described in any greater detail herein. The signal labeled STBOUT is the strobe signal output by the glitch protection circuit of FIG. 5.

The output signal generated by pseudo-differential amplifier 405 is input to NAND gate 570 and inverter 560, which is part of inverter string 560–565. As with inverter string 546–553, inverter string 560–565 provides a delayed version of the signal output by amplifier 405. It is important to note that the delay provided by delay string 546–553, is longer than anticipated glitches and shorter than a dead cycle. In one embodiment, glitch protection is applied to all signal transitions, strobe signals as well as data signals. The functionality provided by the detection circuit is applied only to differential strobe signals. When the output signal of the detection circuit is enabled, STBOUT is latched until the strobe signals become differential again. Thus, even if a glitch occurs that is longer than the delay provided by delay string 546–553, the glitch is not passed through the glitch protection circuit.

The output of inverter string 560–565 and the output of amplifier 405 provide input signals to NAND gate 570. The output of NAND gate 570 provides an input to NAND gate 575 and is used to turn transistor 500 off through NOR gate 525 and to turn transistor 520 off through inverter 555 and NAND gate 537. Thus, transistors 500 and 520 are turned off a predetermined length of time after STB and STB# are simultaneously high.

When transistors 500 and 520 are turned off, the signal generated by amplifier 400, and thus the strobe signals, are disconnected from node 580. The effect of amplifier 400 output being cut off from node 580 is that node 580 latches into the state present at the time of cut off. This latches the values of the strobe signals at those values until transistors 500 and 520 are turned on again.

When the strobe signals become differential again, transistors 500 and 520 are turned on again. Delay string 560–565 is not used to delay turn on, so no performance penalty is incurred. Thus, delay string 560–565 is used to turn transistors 500 and 520 off, but not to turn transistors 500 and 525 on.

Cutting off the strobe signals provides glitch protection by latching the strobe output signals in known states and preventing the circuitry from following glitches caused by transients, ringback, etc. This prevents the data buffers (not shown in FIG. 5) receiving the strobe signals from changing states in response to a glitch rather than a strobe transition.

In the foregoing specification, the present invention has been described with reference to specific embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A device comprising:
   an interface to receive a pair of strobe signals from a bus; and
   a latching circuit coupled to the interface, the latching circuit to latch the pair of strobe signals for a first predetermined period of time, and to continue latching the pair of strobe signals when the pair of strobe signals are of an equivalent logic state during the first predetermined period of time.

2. The device of claim 1, wherein the latching circuit comprises circuitry to discontinue latching of the pair of strobe signals when the pair of strobe signals are in different logic states during the first predetermined period of time.

3. The device of claim 1, wherein the pair of strobe signals is received from a source synchronous device.

4. The device of claim 1, wherein the pair of strobe signals is received from a memory device.

5. The device of claim 1, wherein the bus comprises an externally terminated bus.

6. The device of claim 1, wherein the device comprises a processor.

7. The device of claim 1, wherein the device comprises a memory device.

8. The device of claim 1, wherein the latching circuit comprises:
   a detection circuit coupled to receive the pair of strobe signals, the detection circuit to generate an intermediate signal of a first state when the pair of strobe signals are in the equivalent logic state during the first predetermined period of time;
   a first latch circuit coupled to the detection circuit and to receive a first of the pair of strobe signals, the first latch circuit to latch the first strobe signal for the first predetermined period of time after each logic state transition and to continue to latch the first strobe signal in response to the intermediate signal from the detection circuit; and
   a second latch circuit coupled to the detection circuit and to receive a second of the pair of strobe signals, the second latch circuit to latch the second strobe signal for the first predetermined period of time after each logic state transition and to continue to latch the second strobe signal in response to the intermediate signal from the detection circuit.

9. The device of claim 1 further comprising a detection circuit coupled to the interface and to the latching circuit, wherein the detection circuit comprises:
   a comparator having a first input port coupled to receive the first strobe signal and a second input port coupled to receive a first reference signal the comparator to generate a signal at an output port indicating whether the first strobe signal is equivalent to the first reference signal;
   a plurality of inverters coupled in series having a collective input port coupled to the output port of the comparator, the plurality of inverters to output, at a collective output node, a delayed version of the output signal of the comparator;
   an AND gate having a first input node coupled to receive the output signal of the comparator and a second input node coupled to the output node of the plurality of inverters, the output of the AND gate to generate the intermediate signal.

10. A device comprising:
    an interface to receive a pair of strobe signals from a bus; and
    a detection and latching circuit coupled to the interface, the detection and latching circuit to latch the pair of strobe signals for a first predetermined period of time after each transition by the pair of strobe signals, the detection and latching circuit further to detect when the pair of strobe signals are in an equivalent logic state and to continue latching the pair of strobe signals when the pair of strobe signals are of an equivalent logic state during the first predetermined period of time.

11. The device of claim 10, wherein the detection and latching circuit comprises circuitry to discontinue latching of the pair of strobe signals when the pair of strobe signals are in different logic states during the first predetermined period of time.

12. The device of claim 10, wherein the pair of strobe signals is received from a source synchronous device.

13. The device of claim 10, wherein the pair of strobe signals is received from a processor.

14. The device of claim 10, wherein the bus comprises an externally terminated bus.

15. The device of claim 10, wherein the device comprises a processor.

16. The device of claim 10, wherein the device comprises a memory device.

17. The device of claim 10 wherein the detection and latching circuit comprises:
- a first node coupled to receive a first strobe signal of the pair of strobe signals;
- a second node coupled to receive a second strobe signal of the pair of strobe signals;
- a first detection circuit coupled with the first node and the second node, the first detection circuit to generate a first intermediate signal of a first state when the pair of strobe signals are in the equivalent logic state during the first predetermined period of time;
- a first latch circuit coupled with the first node and to the first detection circuit, the first latch circuit to latch the first strobe signal for the first predetermined period of time after each logic state transition and to continue to latch the first strobe signal in response to the first intermediate signal from the first detection circuit;
- a second detection circuit coupled with the first node and the second node, the second detection circuit to generate a second intermediate signal of a first state when the pair of strobe signals are in the equivalent logic state during the first predetermined period of time; and
- a second latch circuit coupled with the second node and the second detection circuit, the second latch circuit to latch the second strobe signal for the first predetermined period of time after each logic state transition and to continue to latch the second strobe signal in response to the second intermediate signal from the second detection circuit.

18. The device of claim 17, wherein the first detection circuit comprises:
- a first comparator having a first input port coupled to receive the first strobe signal and a second input port coupled to receive a first reference signal the first comparator to generate a signal at an output port indicating whether the first strobe signal is equivalent to the first reference signal;
- a first plurality of inverters coupled in series having a collective input port coupled to the output port of the first comparator, the first plurality of inverters to output, at a collective output node, a delayed version of the output signal of the first comparator; and
- a first AND gate having a first input node coupled to receive the output signal of the first comparator and a second input node coupled to the output node of the first plurality of inverters, the output of the first AND gate to generate the first intermediate signal.

19. The device of claim 17 wherein the second detection circuit comprises:
- a second comparator having a first input port coupled to receive the first strobe signal and a second input port coupled to receive a first reference signal the second comparator to generate a signal at an output port indicating whether the first strobe signal is equivalent to the first reference signal;
- a second plurality of inverters coupled in series having a collective input port coupled to the output port of the second comparator, the second plurality of inverters to output, at a collective output node, a delayed version of the output signal of the second comparator; and
- a second AND gate having a first input node coupled to receive the output signal of the second comparator and a second input node coupled to the output node of the second plurality of inverters, the output of the second AND gate to generate the second intermediate signal.

20. A device having latching circuitry to latch a pair of strobe signals provided in association with a bus transaction for a predetermined period of time after a logic state transition and to continue latching the strobe signals beyond the predetermined period of time when, during the predetermined period of time, the strobe signals are in an equivalent logic state.

21. The device of claim 20, wherein the latching circuitry discontinues latching of the pair of strobe signals after the predetermined period of time when the pair of strobe signals are in different logic states during the predetermined period of time.

22. The device of claim 20, wherein the device comprises a processor.

23. The device of claim 20, wherein the device comprises a memory device.

24. The device of claim 20, wherein the latching circuitry comprises:
- a detection circuit coupled to receive the pair of strobe signals, the detection circuit to generate an intermediate signal of a first state when the pair of strobe signals are in the equivalent logic state during the first predetermined period of time;
- a first latch circuit coupled to the detection circuit and to receive a first of the pair of strobe signals, the first latch circuit to latch the first strobe signal for the first predetermined period of time after each logic state transition and to continue to latch the first strobe signal in response to the intermediate signal from the detection circuit; and
- a second latch circuit coupled to the detection circuit and to receive a second of the pair of strobe signals, the second latch circuit to latch the second strobe signal for the first predetermined period of time after each logic state transition and to continue to latch the second strobe signal in response to the intermediate signal from the detection circuit.

* * * * *